March 25, 1969 J. S. ALLEN ET AL 3,435,346

ELECTRONICALLY TUNABLE RECEIVER

Filed May 31, 1966

Sheet 1 of 2

INVENTORS
EDWARD HIRSHFIELD
JAMES S. ALLEN

BY John F Lawler
ATTORNEY

INVENTORS
EDWARD HIRSHFIELD
JAMES S. ALLEN
BY John F. Lawler
ATTORNEY

United States Patent Office 3,435,346
Patented Mar. 25, 1969

3,435,346
ELECTRONICALLY TUNABLE RECEIVER

James S. Allen, Saratoga, and Edward Hirshfield, San Jose, Calif., assignors to Sylvania Electric Products Inc., a corporation of Delaware Filed May 31, 1966, Ser. No. 553,743
Int. Cl. H04b 1/16, 1/36
U.S. Cl. 325—423 10 Claims

ABSTRACT OF THE DISCLOSURE

An electrically tuned receiver employing a voltage tunable filter, having an yttrium iron garnet element, as a preselector; a backward wave oscillator to generate a local oscillator signal; a discriminator comprising a pair of yttrium iron garnet element filters; and a pair of magnetization coils which are individually and separately associated with the preselector and discriminator filters. A sweep current energizes said magnetization coils so that the discriminator response characteristic tracks the preselector response characteristic. A constant current signal passes only through the coil of the discriminator filters so that the filter characteristics are always offset by a constant amount from the preselector response characteristic.

Figure 1:
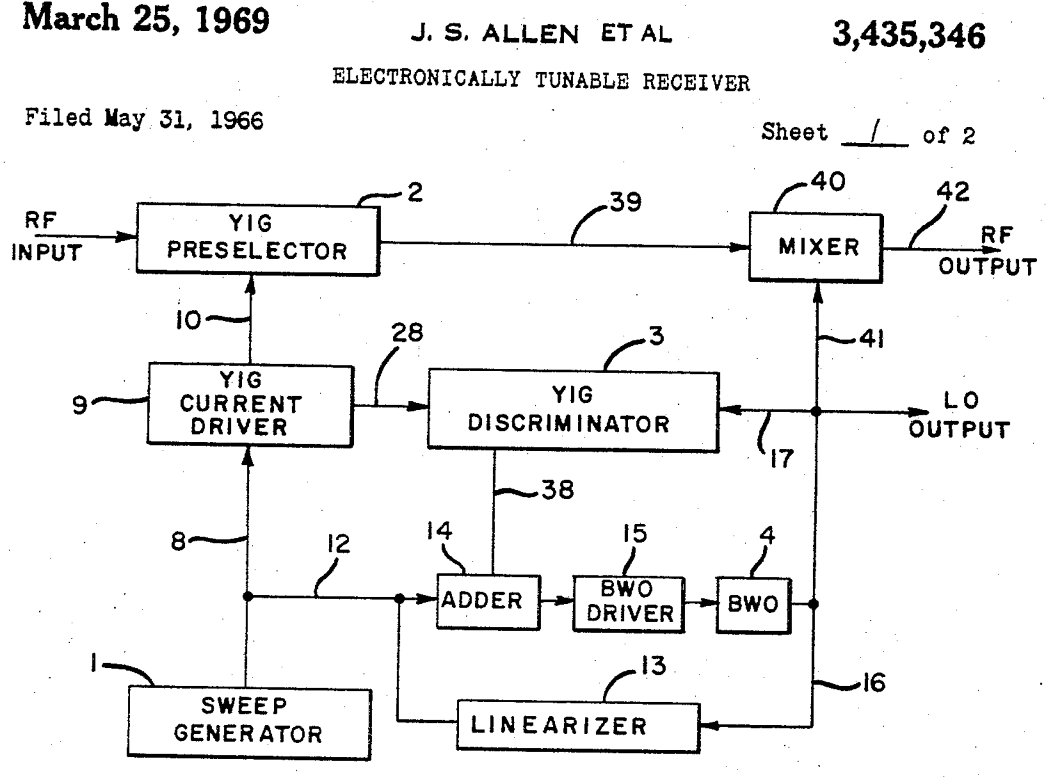

This invention relates to radio frequency receivers and more particularly to an improved YIG-tuned superheterodyne receiver.

Electronically tuned receivers desirably have a larger bandwidth than mechanically tuned receivers and are more easily adaptable to remote control. An electronically tuned receiver may employ a preselector for determining the frequencies of received signals that are processed by the receiver and such preselector may comprise a voltage-tunable filter having an yttrium iron garnet (YIG) element. YIG filters have narrow band response characteristics and linear tuning characteristics, and therefore reduce image response and spurious signals. An example of such a superheterodyne receiver, which produces a constant intermediate frequency (IF) signal and employs a backward wave oscillator (BWO) to generate a local oscillator signal, is disclosed by J. G. Fitzpatrick et al., pages 15–11 through 15–13, Proceedings, 1963 National Winter Convention On Military Electronics.

The tuning characteristic of the YIG preselector is linear, i.e., the center frequency of the preselector response characteristic is a linear function of a sweep current that is applied to the associated magnetization coil. The tuning characteristic of the BWO, however, is nonlinear, i.e., the output frequency of the BWO is a nonlinear function of an applied sweep voltage. A linearly varying sweep signal applied to the preselector changes the center frequency of its response characteristic and thus tunes the receiver at a linear rate. In order to maintain the frequency of the IF signal constant (the difference frequency between the BWO output frequency and the center frequency of the preselector response characteristic), a nonlinear sweep signal is applied to the BWO to cause its output frequency to also vary linearly.

Cavity discriminator automatic frequency control techniques are employed to shape the BWO sweep signal. The output of the discriminator, which comprises a pair of YIG filters, biases the BWO so that its output frequency at all times tracks offset from the center frequency of the preselector response characteristic by a constant amount. In order to accomplish this operation, the response characteristic of the YIG filters, and thus the discriminator response characteristic, must also track offset from the preselector response characteristic by a constant amount.

A prior art technique for causing such offset tracking employs a first sweep current source driving only the magnetization coil of the YIG filters of the discriminator and a second sweep current osurce for energizing only the magnetization coil. The same sweep voltage is applied to the control element of each current source. In order to maintain a constant difference frequency between the center frequency of the discriminator response characteristic (the BWO output frequency) and the center frequency of the preselector response characteristic, the output currents of the sweep current sources must vary at the same rate and must be offset from each other by a constant amount. In practice, it is difficult to maintain these relationships between the outputs of the current sources over a long period of time and over a wide range of environmental conditions such as temperature.

An object of this invention is the provision of an improved YIG tuned superheterodyne receiver.

Another object is the provision of an improved YIG tuner for a superheterodyne receiver.

Another object is the provision of a YIG tuner that generates first and second linearly varying sweep current signals which are offset from each other and which vary at the same rate.

Briefly, a sweep voltage is applied to a first current source which produces a sweep current signal that is proportional to the sweep voltage. The sweep current energizes the magnetization coils of both the YIG preselector and the YIG filters of the discriminator so that the discriminator response characteristic tracks the preselector response characteristic. A constant current signal from a second current source passes only through the coil of the YIG filters so that the filter characteristics are at all times offset by a constant amount from the preselector response characteristic. Variable resistors connected in shunt with the coils provide mechanisms for adjusting the slopes of the tuning characteristics of the preselector and filters to be equal. Diodes connected in shunt with the coils bypass transient signals generated in the coils during reset of the sweep voltage.

Figure 3A:
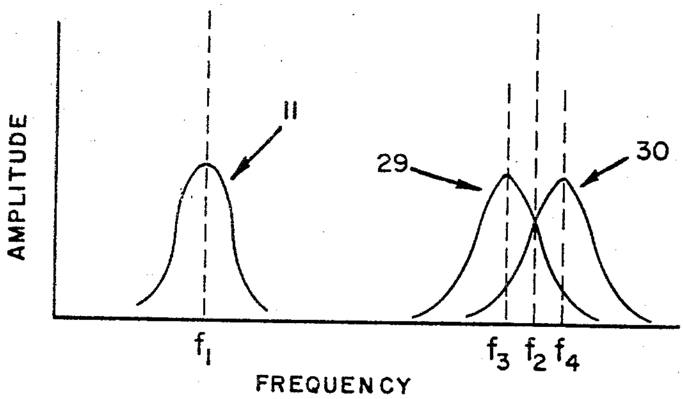
Figure 3B:
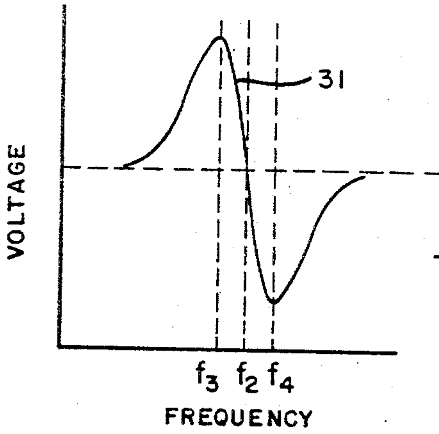
Figure 2:
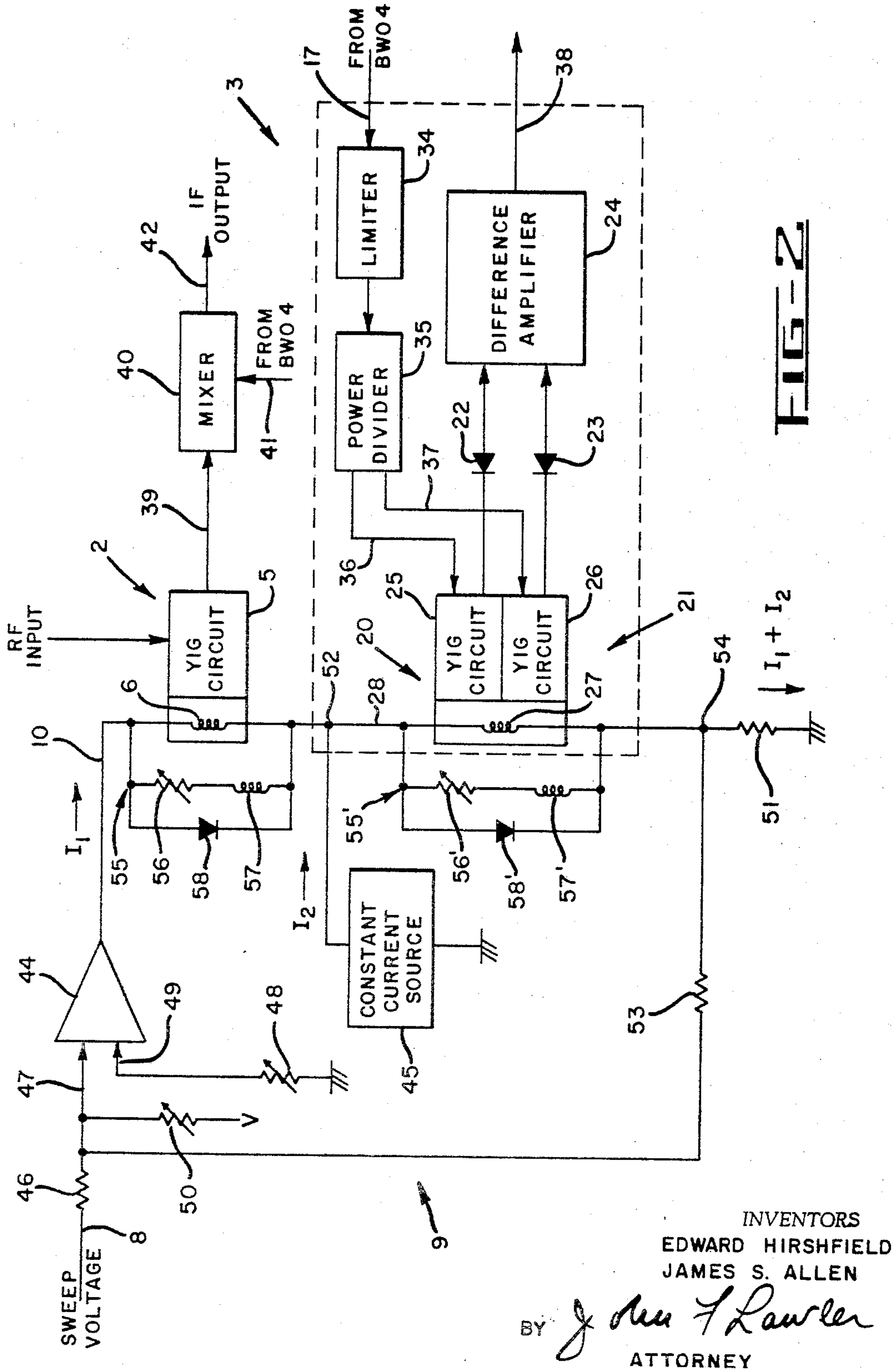

The above and other objects of this invention will be understood from the following description of a preferred embodiment thereof, taken with the accompanying drawings in which:

FIGURE 1 is a block diagram of the radio frequency portion of a receiver embodying this invention;

FIGURE 2 is a detailed schematic and block diagram of the YIG discriminator and the YIG current driver of FIGURE 1; and FIGURE 3 is a set of curves showing circuit performance wherein FIGURE 3A shows curves representing the response characteristics of the YIG preselector and the YIG filters of the discriminator; and FIGURE 3B is a curve representing the response characteristic of the YIG discriminator.

Referring to FIGURE 1, a receiver embodying this invention comprises a sweep generator 1, a YIG preselector 2, a YIG discriminator 3, and a BWO 4. YIG preselector 2, see FIGURE 2, comprises a YIG circuit 5 which is associated with a magnetization coil 6. Circuit 5 includes a sphere of yttrium iron garnet located in a transmission line and described more completely in "Microwave Filters, Impedance-Matching Networks, and Coupling Structures" by George L Matthaei, McGraw-Hill Book Company, 1964, Sections 17.07 and 17.08.

Sweep generator 1 produces a sweep voltage, such as a sawtooth sweep voltage, on line 8 which varies linearly as a function of time. The sweep voltage on line 8 is applied to YIG current driver 9 which generates a sweep current signal on line 10 which is proportional to the sweep voltage. The sweep current signal on line 10 is applied to coil 6 to provide the preselector with the response characteristic illustrated at 11 in FIGURE 3A. This sweep current signal tunes the preselector so that response characteristic 11 sweeps linearly over the band of operating frequencies of the receiver.

The sweep voltage on line 12 is shaped by linearizer 13 which bypasses a portion of the sweep voltage. The shaped sweep voltage is coupled through adder 14 to BWO driver 15 in order to control the BWO output frequency which is offset from the center frequency $f_1$ of the preselector response characteristic 11 by a constant difference frequency. The output of the BWO on line 16 is applied to linearizer 13 to adjust the sweep voltage passed by the latter and thus to provide coarse linearization of the response characteristic of the BWO. Linearizer 13 may, by way of example, be a diode ladder network. The output of the BWO on line 17 is applied to discriminator 3.

Discriminator 3 comprises a pair of YIG filters 20 and 21, see FIGURE 2, a pair of detectors 22 and 23, and a difference amplifier 24. YIG filters 20 and 21 comprise YIG circuits 25 and 26, respectively, which are both associated with the same magnetization coil 27. Each of the circuits 25 and 26, like preselector circuit 5, includes a sphere of yttrium iron garnet located in a transmission line. YIG current driver 9 produces a second sweep current output on line 28 which is also proportional to the sweep voltage on line 8 and which differs from the sweep current signal on line 10 by a constant amount. The sweep current signal on line 28 is applied to coil 27 to provide filters 20 and 21 with the response characteristics 29 and 30, respectively, see FIGURE 3A.

The YIG spheres comprising circuits 25 and 26 are oriented with respect to each other such that the filter response characteristics 29 and 30 are offset from each other and are symmetrical about the frequency $f_2$. Alternatively, the filter response characteristics 29 and 30 may be offset from each other by employing a separate magnetization coil associated with each YIG circuit of the discriminator and applying a constant current only to one of these coils. Amplifier 24 operates on the detected outputs of the YIG filters so as to combine the filter response characteristics 29 and 30 to provide the discriminator response characteristic 31, see FIGURE 3B, which has a center frequency $f_2$. Discriminator 3 is tuned by the sweep current signal on line 28 so that the center frequency $f_2$ of the discriminator response characteristic 31 is at all times equal to the desired BWO operating frequency.

The maximum amplitude of the BWO output on line 17 is controlled by limiter 34. The output of the limiter is split by power divider 35 and applied on lines 36 and 37 to filters 20 and 21, respectively. Amplifier 24 is responsive to the detected outputs of the YIG filters and generates an output voltage on line 38 which is proportional to the difference in frequency between the center frequency $f_2$ of the discriminator response characteristic 31 (which is also the desired BWO output frequency) and the actual frequency of the BWO output on line 17. The error voltage on line 38 is applied to adder 14 where it is added to the modified output of sweep generator 1 and is then applied to driver 15 to control the operating frequency of the BWO.

Signals passed on line 39 by preselector 2 are combined in mixer 40 with the output of the BWO on line 41. The output of the mixer on line 42 is the IF signal which has a constant frequency.

YIG driver 9 comprises a sweep current source 44, which may be an operational amplifier, and a constant current source 45. The output of sweep generator 1 on line 8 is coupled through input resistor 46 to the inverting input 47 of operational implifier 44. A variable resistor 48 is connected between a ground reference potential and the non-inverting input 49 of amplifier 44 to provide a reference signal to the amplifier. A variable resistor 50 is connected between a voltage source V and the inverting input terminal 47. Coils 6 and 27 and a sampling resistor 51 are connected in series between the output of amplifier 44 and ground. The output of current source 45 is connected to the junction 52 of coils 6 and 27. A feedback resistor 53 is connected between the inverting input 47 and junction 54 of sampling resistor 51 and coil 27.

Coil 6 is shunted by the series circuit 55, which is made up of variable resistor 56 and inductor 57, and by diode 58. Coil 27 is shunted by a similar series circuit 55' and diode 58'.

The tuning voltage on line 8 may, by way of example, be a sawtooth sweep voltage with a magnitude varying between negative and positive voltages. Variable resistor 50 is adjusted to provide an offset or bias voltage to the inverting input terminal 47 so that when the tuning voltage has a maximium negative value, the operational amplifier generates a current output on line 10 which has a minimum value. Variable resistor 48 biases amplifier 44 so that the magnitude of the current applied to the inverting input 47 and the noninverting input 49 are equal. The current output $I_1$ of amplifier 44 passes through both coils 6 and 27 and sampling resistor 51. Feedback resistor 53 couples a portion of the current passing through coils 6 and 27 to the inverting input 47 to cause the current output $I_1$ of the amplifier to be directly proportional to the sweep voltage applied to the inverting input. Sampling resistor 51 together with feedback resistor 53 determines the magnitude of the feedback current.

Since the same sweep current $I_1$ passes through both coils 6 and 27, the response characteristics 29 and 30 of YIG filters 20 and 21, respectively, and thus the discriminator response characteristic 31, will at all times track the preselector response characteristic 11.

The magnitude of the constant current $I_2$, which is independent of the sweep voltage from generator 1, passes through coil 27 associated with YIG filters 20 and 21 and does not energize coil 6. Since the path of constant current $I_2$ is limited to coil 27, the center frequencies $f_3$ and $f_4$ of filter response characteristics 29 and 30, respectively, and thus the center frequency $f_2$ of the discriminator response characteristic 31, are offset from the center frequency $f_1$ of the preselector response characteristic 11 by fixed amounts. Thus, since the same tuning current $I_1$ passes through both coils 6 and 27 while the constant current $I_2$ passes only through coil 27, the discriminator response characteristic 31 accurately tracks offset from the preselector response characteristic 11 over long time intervals and wide variations of ambient conditions such as temperature. The frequency of the IF signal also remains constant for the same reason.

Although the tuning characteristics of YIG filters are linear, the tuning characteristic of any two YIG filters may be different, i.e., the slope of the tuning characteristics of the filters may be different. In accordance with this invention, the resistances of variable resistors 56 and 56' are varied to adjust the slopes of the tuning characteristics of the YIG preselector and the YIG filters to be equal. Inductors 57 and 57' are connected in series with variable resistors 56 and 56', respectively, to compensate for changes in shunt impedance with frequency. The resistances and inductances of resistor 56, inductor 57, and coil 6 are related by the following relationship $$R_1L_2=R_2L_1$$

wherein $R_1$ is the resistance of resistor 56, $R_2$ is the resistance of coil 6, $L_1$ is the inductance of inductor 57, and $L_2$ is the inductance of the coil 6. The resistances and inductances of resistor 56', inductor 57' and coil 27 are related by a similar relationship.

In certain applications, it is desirable to have a tuning voltage which varies linearly at a prescribed rate from a minimum voltage to a maximum voltage and which is rapidly reset to the minimum voltage. Since the electric field associated with a coil does not decay instantaneously, a large voltage transient may be generated by the coil during reset of the sweep generator. In accordance with this invention, diodes 58 and 58' bypass voltage transients generated by coils 6 and 27, respectively, during reset of generator 1 so that these voltage transients will not damage associated circuitry.

Although this invention is described in relation to a specific embodiment thereof, the scope of the invention is defined in the following claims rather than by the above detailed description.

What is claimed is:

1. In an electronically tunable receiver including a voltage controlled oscillator responsive to a tuning voltage from a sweep generator, a yttrium iron garnet (YIG) preselector, a YIG discriminator comprising a pair of YIG filters each responsive to the output of the oscillator, and a mixer responsive to the oscillator output and the preselector output for generating an intermediate frequency signal, a YIG tuner comprising a first current source responsive to the tuning voltage for generating a sweep current proportional thereto, a second current source generating a current output having a constant value, a first magnetization coil associated with the YIG preselector and responsive only to the sweep current from said first current source whereby to produce a preselector filter response characteristic with a center frequency directly proportional to the magnitude of the sweep current, and a second magnetization coil associated with said YIG filters and responsive both to sweep current from said first current source and to the constant output current from said second current source whereby to produce in each of the YIG filters a response characteristic which tracks the preselector filter response characteristic with a constant offset.

2. The tuner according to claim 1 including a variable resistor connected in shunt with one of said magnetization coils and adjustable for tuning the associated YIG device.

3. The tuner according to claim 2 with first and second diodes connected in shunt with said first and second coils, respectively.

4. The tuner according to claim 1 wherein said first current source has an output terminal and each of said coils has first and second terminals, said first terminals of said coils being electrically connected to the output terminal of said first current source so that the sweep current flows through each of said coils and wherein said first current source comprises an operational amplifier having an input responsive to the tuning voltage, a sampling resistor having a first terminal connected to a ground reference potential and having a second terminal electrically connected to the second terminal of one of said coils, the second terminal of the other one of said coils being electrically connected to ground, and a feedback resistor having a first terminal connected to the input of said operational amplifier and having a second terminal connected to the second terminal of said sampling resistor.

5. The tuner according to claim 1 wherein said coils have first and second terminals and wherein said first current source comprises an operational amplifier having an inverting input resistively coupled to the source of tuning voltage and having an output terminal connected to the first terminal of said first coil, means for electrically connecting the second terminals of said first and second coils, a sampling resistor having a first terminal connected to the first terminal of said second coil and having a second terminal electrically connected to a ground reference potential, a feedback resistor having a first terminal connected to the first terminal of said sampling resistor and having a second terminal connected to the inverting input of said operational amplifier, a first series circuit connected in shunt with one of said coils, said first series circuit comprising, a first resistor, and a first inductor, the resistance $R_1$ of said first resistor, the resistance $R_2$ of said one coil, the inductance $L_1$ of said first inductor, and the inductance $L_2$ of said one coil satisfying the relationship $$R_1L_2=KR_2L_1$$

wherein K is a constant, means for varying the resistance of said first resistor whereby to adjust and equalize the slopes of the tuning characteristics of the preselector and the YIG filters, and first and second diodes connected in shunt with said first and second coils, respectively, for bypassing transient signals generated during reset of the tuning voltage.

6. The tuner according to claim 5 including a second series circuit comprising a second resistor and a second inductor connected in shunt with the other one of said coils.

7. A tuner assembly comprising a first current source generating a sweep current signal, first and second devices each responsive to an associated magnetic field for magnetically biasing said devices, each of said devices comprising a magnetization circuit including a magnetization coil responsive to the sweep current from said first current source for biasing said magnetization circuit to produce a magnetic field proportional to the magnitude of the sweep current, and a circuit element associated with said magnetization coil and responsive to the magnetic field produced thereby for magnetically biasing said element such that said device has a response characteristic which is proportional to the sweep current, and a second current source generating a current output having a constant magnitude, said second coil being responsive to the output of said second current source for magnetically biasing said second element such that said second device has a response characteristic which is offset by a constant amount from the response characteristic of said first device.

8. The tuner according to claim 7 wherein said devices are filters and wherein said elements are yttrium iron garnet.

9. The tuner according to claim 8 wherein each of said coils has first and second terminals, said first terminals of said coils being electrically connected to the output terminal of said first current source so that the sweep current flows through each of said coils and wherein said first current source comprises a source of tuning voltage, an operational amplifier havng an input responsive to the tuning voltage, a sampling resistor having a first terminal connected to a ground reference potential and having a second terminal electrically connected to the second terminal of one of said coils, the second terminal of the other one of said coils being electrically connected to ground, and a feedback resistor having a first terminal connected to the input of said operational amplifier and having a second terminal connected to the second terminal of said sampling resistor.

10. The tuner according to claim 8 wherein said coils have first and second terminals, and wherein said first current source comprises a source of tuning voltage, an operational amplifier having an inverting input resistively coupled to said source of tuning voltage and having an output terminal connected to the first terminal of said first coil, means for electrically connecting the second terminals of said first and second coils, a sampling resistor having a first terminal connected to the first terminal of said second coil and having a second terminal electrically connected to a ground reference potential, a feedback resistor having a first terminal connected to the first terminal of said sampling resistor and having a second terminal connected to the inverting input of said operational amplifier, first and second series circuits connected in shunt with said first and second coils, respectively, each of said series circuits comprising, a resistor, and an inductor, the resistance $R_1$ of said resistor, the resistance $R_2$ of the associated coil, the inductance $L_1$ of said inductor, and the inductance $L_2$ of the associated coil satisfying the relationship $$R_1L_2=KR_2L_1$$

where K is a constant, means for varying the resistance of said first and second resistors whereby to adjust and equalize the slopes of the tuning characteristics of the YIG filters, and first and second diodes connected in shunt with said first and second coils, respectively, for bypassing transient signals generated during reset of the tuning voltage.

References Cited

UNITED STATES PATENTS 3,244,876 5/1966 Harrison ........... 325—453

WILLIAM C. COOPER, *Primary Examiner.*

BARRY P. SMITH, *Assistant Examiner.*

U.S. Cl. X.R.

325—335